(12) United States Patent
Sunohara et al.

(10) Patent No.: US 9,681,546 B2
(45) Date of Patent: Jun. 13, 2017

(54) WIRING SUBSTRATE AND SEMICONDUCTOR DEVICE

(71) Applicant: SHINKO ELECTRIC INDUSTRIES CO., LTD., Nagano-ken (JP)

(72) Inventors: Satoshi Sunohara, Nagano (JP); Keiji Yoshizawa, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 175 days.

(21) Appl. No.: 14/227,453

(22) Filed: Mar. 27, 2014

(65) Prior Publication Data

US 2014/0301058 A1   Oct. 9, 2014

(30) Foreign Application Priority Data

Apr. 5, 2013   (JP) .................................. 2013-079781

(51) Int. Cl.
*H05K 1/00*   (2006.01)
*H05K 1/11*   (2006.01)
(Continued)

(52) U.S. Cl.
CPC ........ *H05K 1/115* (2013.01); *H01L 23/49822* (2013.01); *H01L 23/49827* (2013.01);
(Continued)

(58) Field of Classification Search
CPC .. H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253;
(Continued)

(56) References Cited

U.S. PATENT DOCUMENTS 8,371,026 B2 *   2/2013   Nomiya .............. H01L 21/4857
174/255
8,373,069 B2 *   2/2013   Kariya et al. .................. 174/255
(Continued)

FOREIGN PATENT DOCUMENTS

JP   2000-332111   11/2000
JP   2006-049804   2/2006
(Continued)

OTHER PUBLICATIONS

Notification of Reasons for Rejection: JP Appin. No. 2013-079781; Oct. 18, 2016; 7 pages.

*Primary Examiner* — Pete Lee
(74) *Attorney, Agent, or Firm* — Fish & Richardson P.C.

(57) ABSTRACT

A wiring substrate includes a first insulation layer, a first wiring layer formed on the first insulation layer, and a second insulation layer stacked on the first insulation layer. The second insulation layer covers the first insulation layer and includes a filler. A third insulation layer is stacked on the second insulation layer. The third insulation layer is filler-free. A through electrode extends through the second and third insulation layers in a thicknesswise direction. A second wiring layer is stacked on the third insulation layer and the through electrode. The through electrode electrically connects the second wiring layer to the first wiring layer.

7 Claims, 13 Drawing Sheets

(51) Int. Cl.
*H01L 23/498* (2006.01)
*H05K 3/46* (2006.01)

(52) U.S. Cl.
CPC ..... *H01L 23/49894* (2013.01); *H05K 3/4673* (2013.01); *H01L 2224/16225* (2013.01); *H01L 2924/15174* (2013.01); *H05K 3/4602* (2013.01); *H05K 2201/0195* (2013.01); *H05K 2201/0209* (2013.01); *H05K 2201/09627* (2013.01); *H05K 2203/1476* (2013.01)

(58) Field of Classification Search
CPC .... H05K 1/0254; H05K 1/0256; H05K 1/036; H05K 1/0366; H05K 1/0373; H05K 1/05; H05K 1/11; H05K 1/111; H05K 1/114; H05K 1/117; H05K 1/119; H05K 1/14; H05K 1/142; H05K 2201/09872; H05K 2201/10378; H05K 3/4602; H05K 3/4691; H05K 1/09; H05K 1/095; H05K 1/097; H05K 2201/0133; H05K 2201/02; H05K 2201/0203; H05K 2201/0206; H05K 2201/0209; H05K 2201/0212; H05K 2201/0215; H05K 2201/0218; H05K 2201/0221; H05K 2201/0224; H05K 2201/0227; H05K 2201/023; H05K 2201/0233; H05K 2201/0236; H05K 2201/0239; H05K 2201/0272; H05K 2201/0323; H05K 2201/0326; H05K 2201/0329; H05K 2201/051; H05K 1/021; H05K 1/0212; H05K 1/0215; H05K 1/023; H05K 1/0231; H05K 1/0233; H05K 1/0234; H05K 1/0243; H05K 1/0295; H05K 1/141; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/10446; H05K 2201/10454; H05K 2201/10462; H05K 2201/10469; H05K 2201/10484; H05K 2201/10492; H05K 2201/105; H05K 2201/10675; H05K 3/30; H05K 3/32; H05K 3/341; H05K 3/3415; H05K 3/3421; H05K 3/3431; H05K 3/36; H05K 3/46; H05K 1/0306; H05K 1/0313; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069
USPC .................................... 174/255–265
See application file for complete search history.

(56) References Cited

U.S. PATENT DOCUMENTS

| | | | |
|---|---|---|---|
| 8,455,766 B2 * | 6/2013 | Tanaka et al. | 174/255 |
| 2001/0042637 A1 * | 11/2001 | Hirose | B23K 26/386 |
| | | | 174/255 |
| 2006/0009026 A1 | 1/2006 | Sawaguchi et al. | |
| 2007/0194412 A1 | 8/2007 | Nakagawa et al. | |
| 2009/0236128 A1 * | 9/2009 | Tsukada | H05K 3/386 |
| | | | 174/256 |
| 2011/0053392 A1 * | 3/2011 | Ihara | H01R 12/57 |
| | | | 439/81 |
| 2011/0133342 A1 | 6/2011 | Arai | |
| 2011/0255352 A1 * | 10/2011 | Kuroda | 365/191 |
| 2012/0153463 A1 * | 6/2012 | Maeda | 257/737 |

FOREIGN PATENT DOCUMENTS

| | | |
|---|---|---|
| JP | 2007-227460 | 9/2007 |
| JP | 2008-085373 | 4/2008 |
| JP | 2010-153571 | 7/2010 |
| JP | 2011-119615 | 6/2011 |

\* cited by examiner

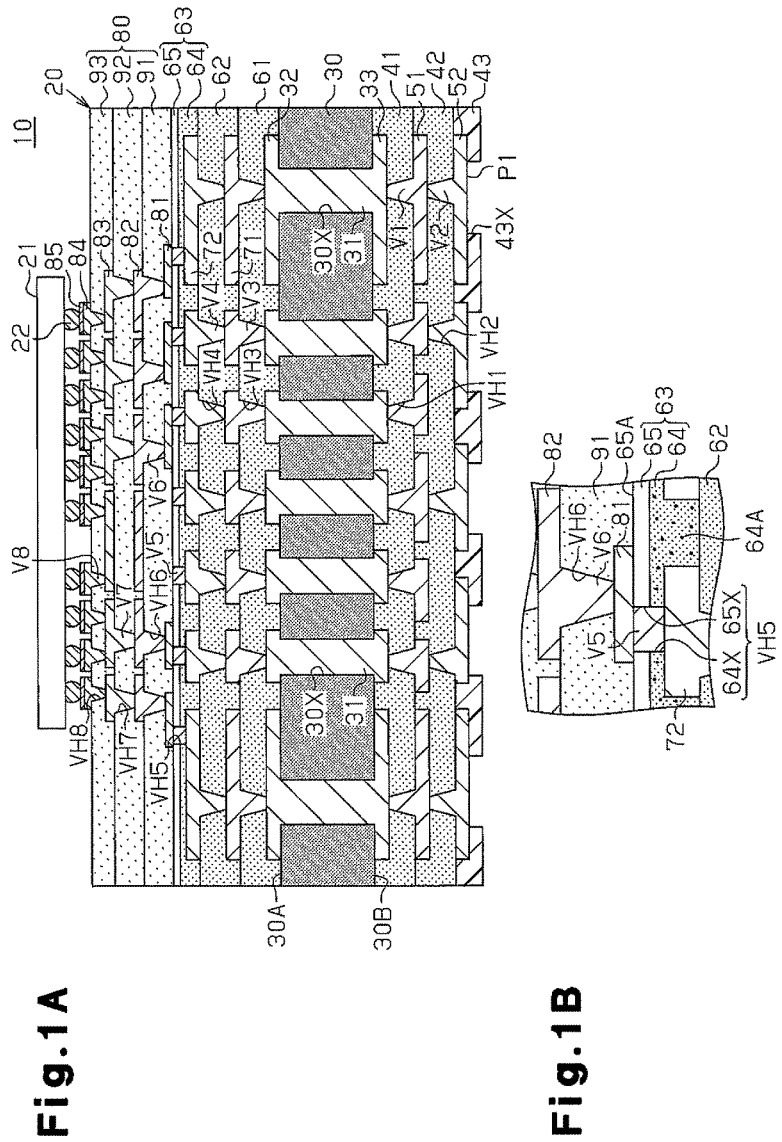

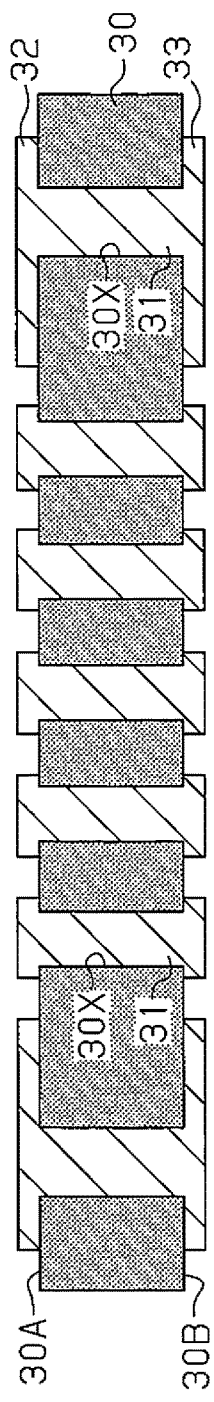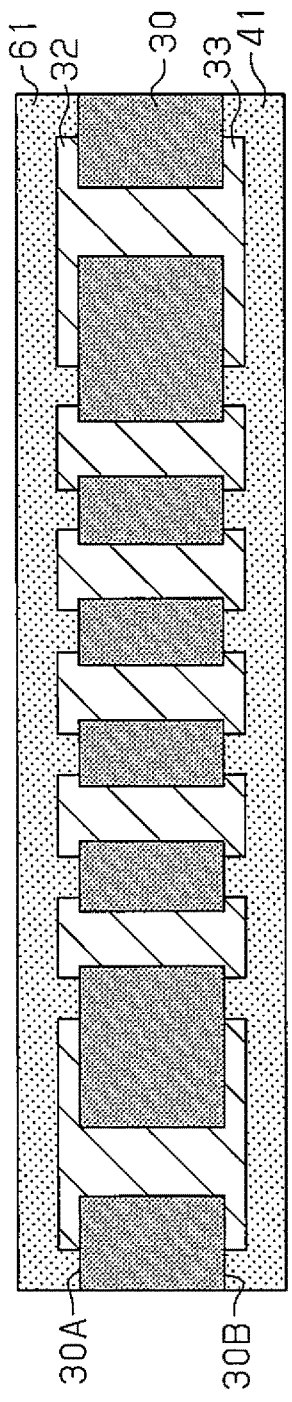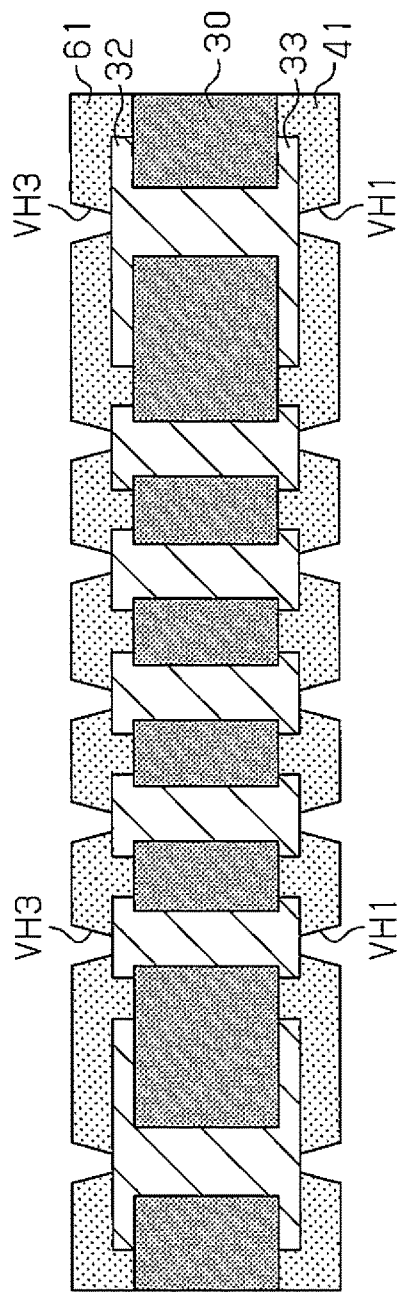

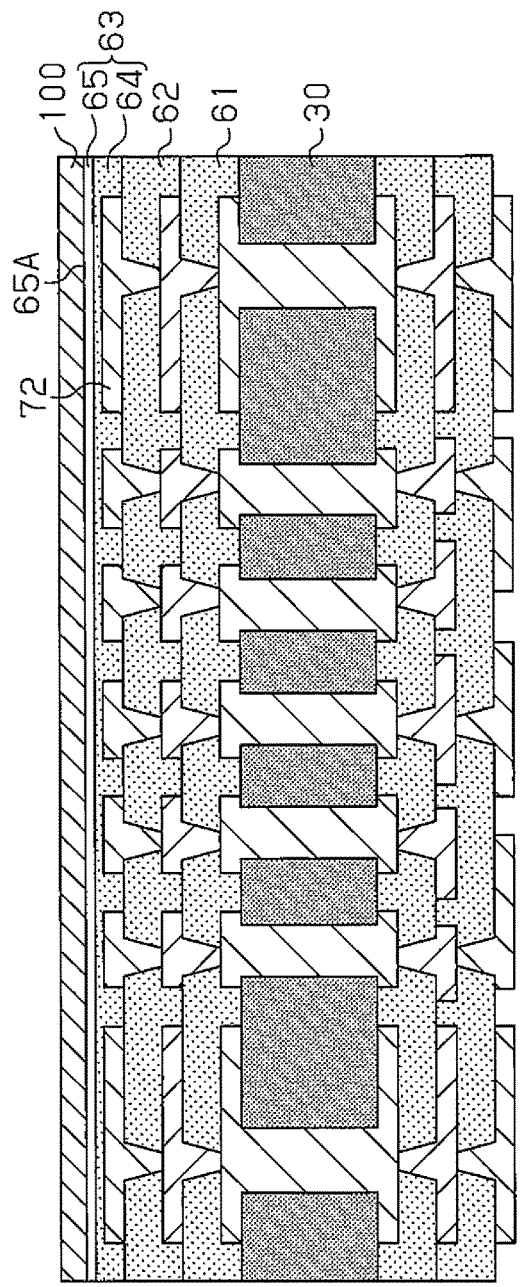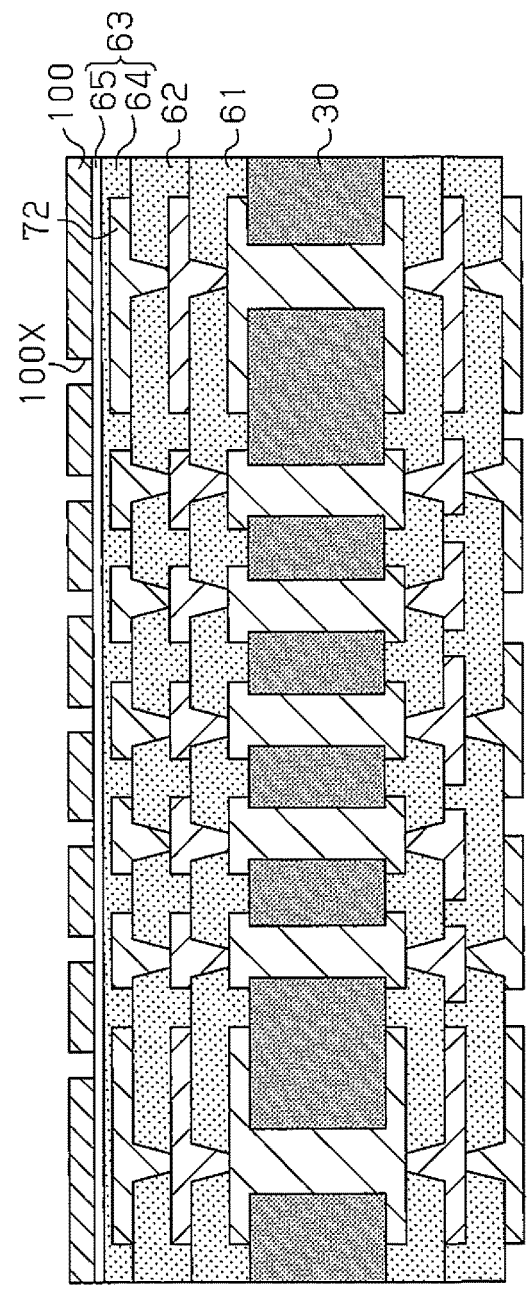

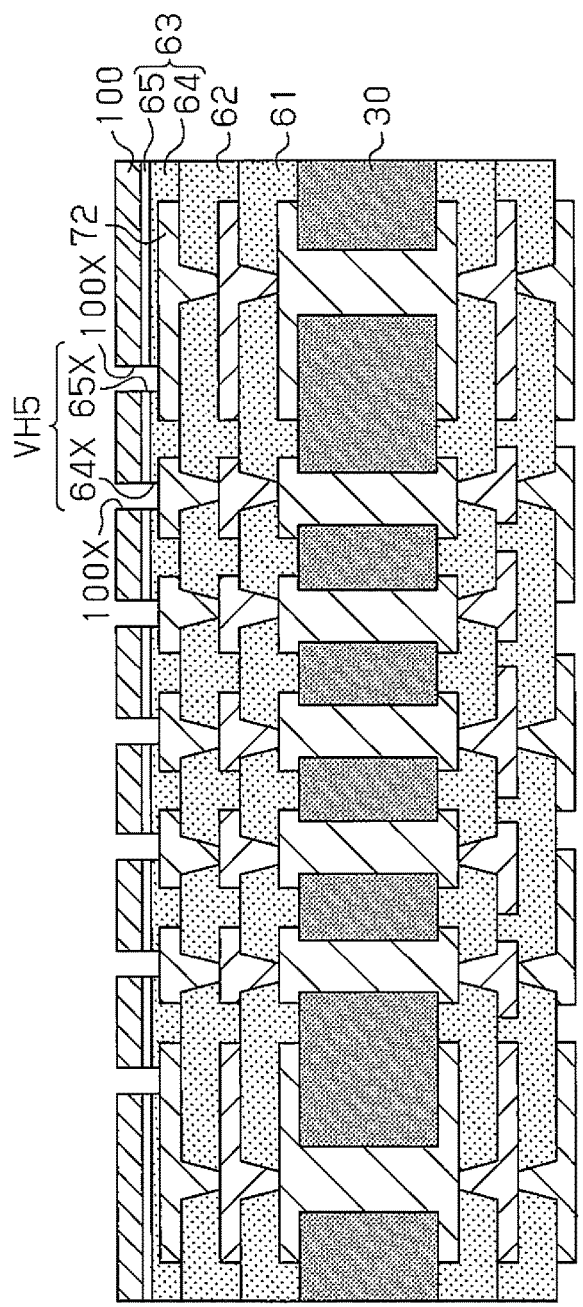
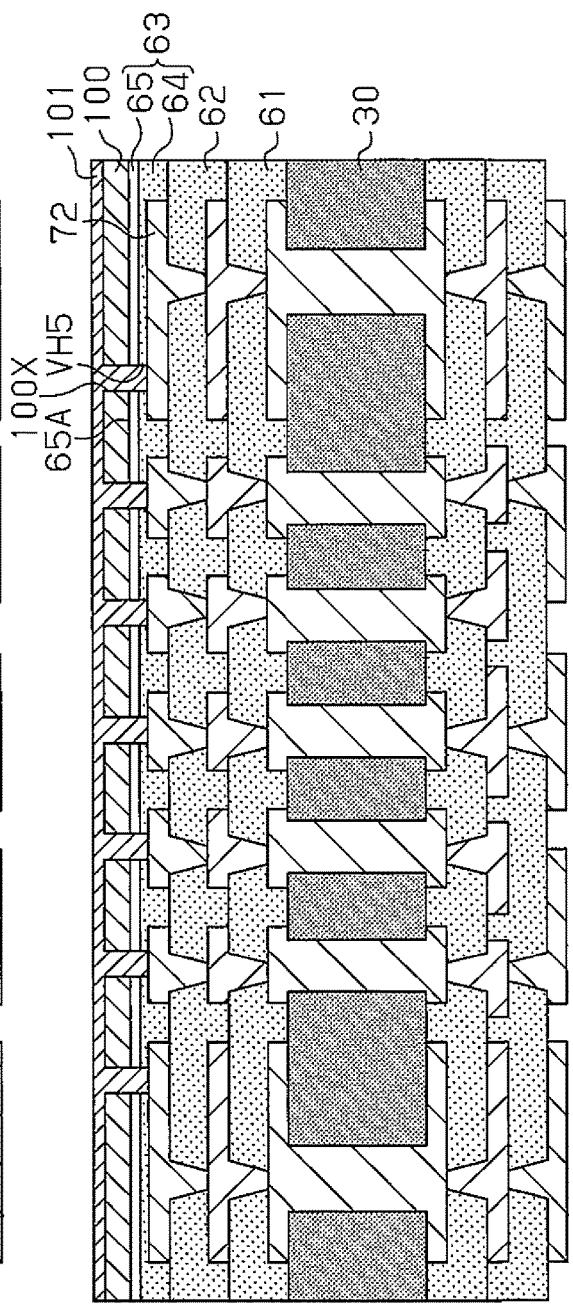
Fig.5A
Fig.5B

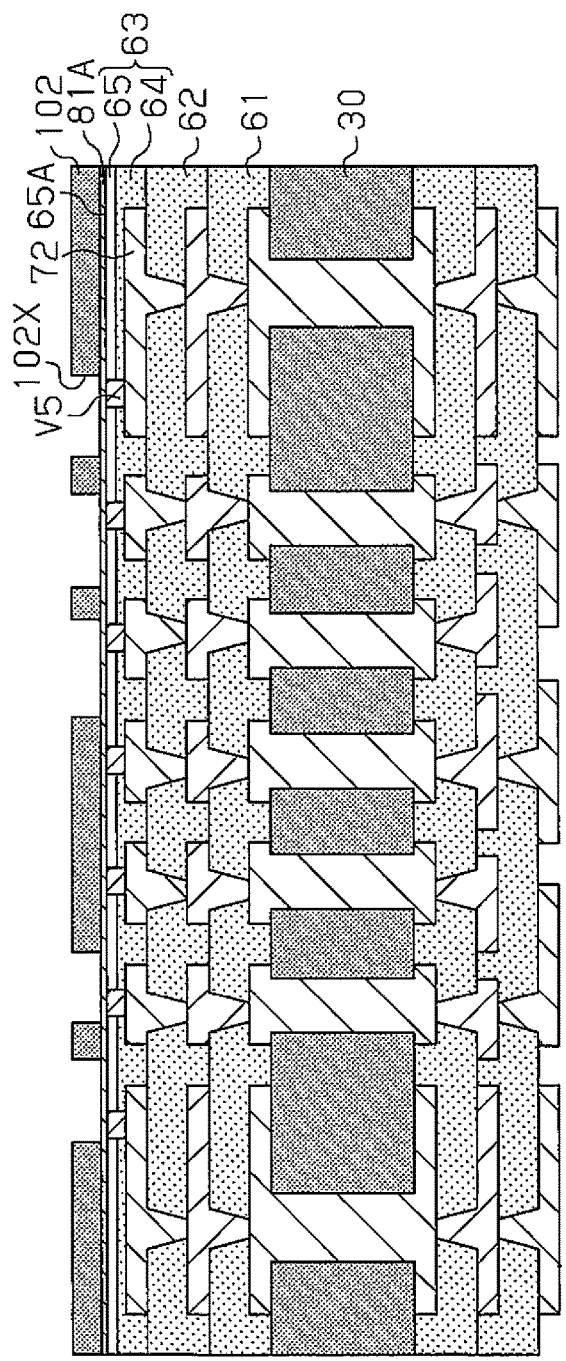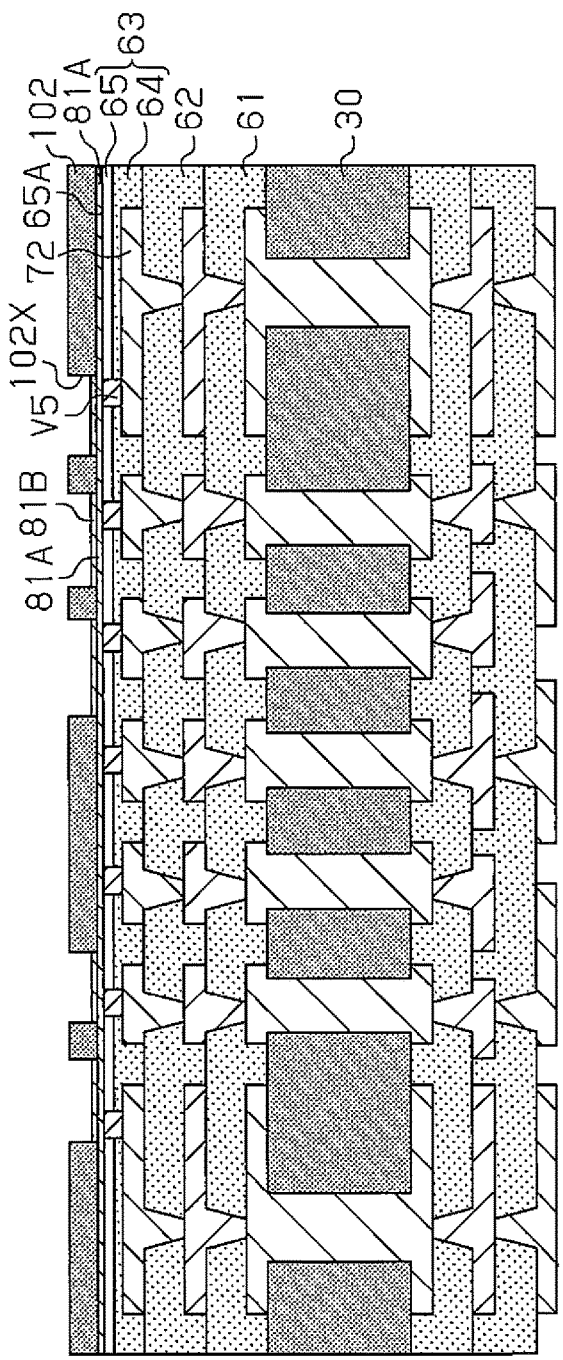

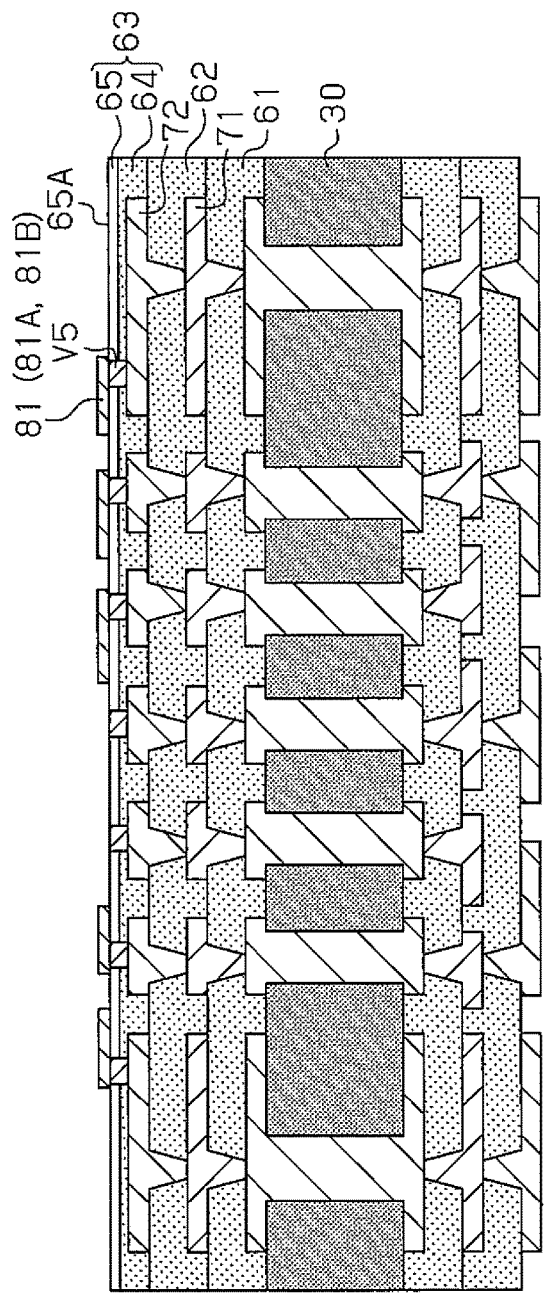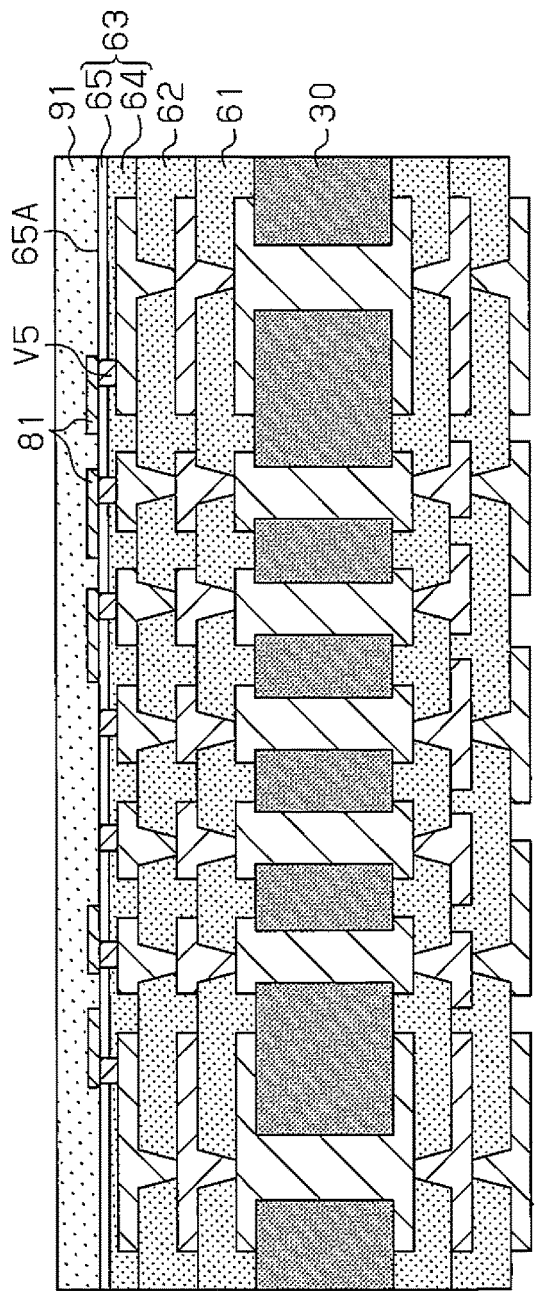

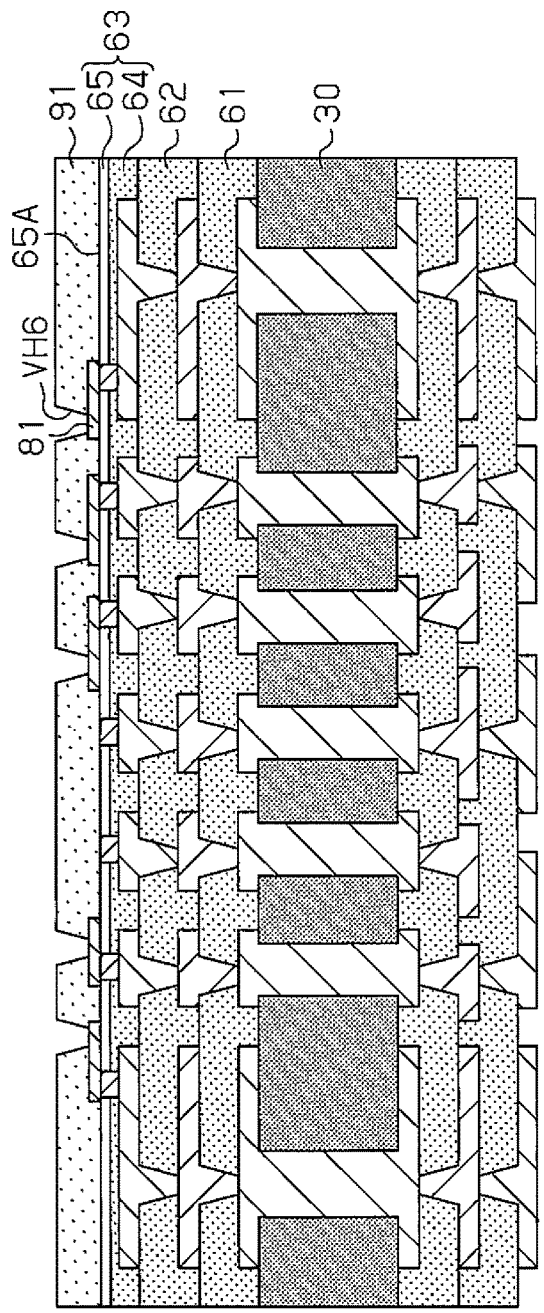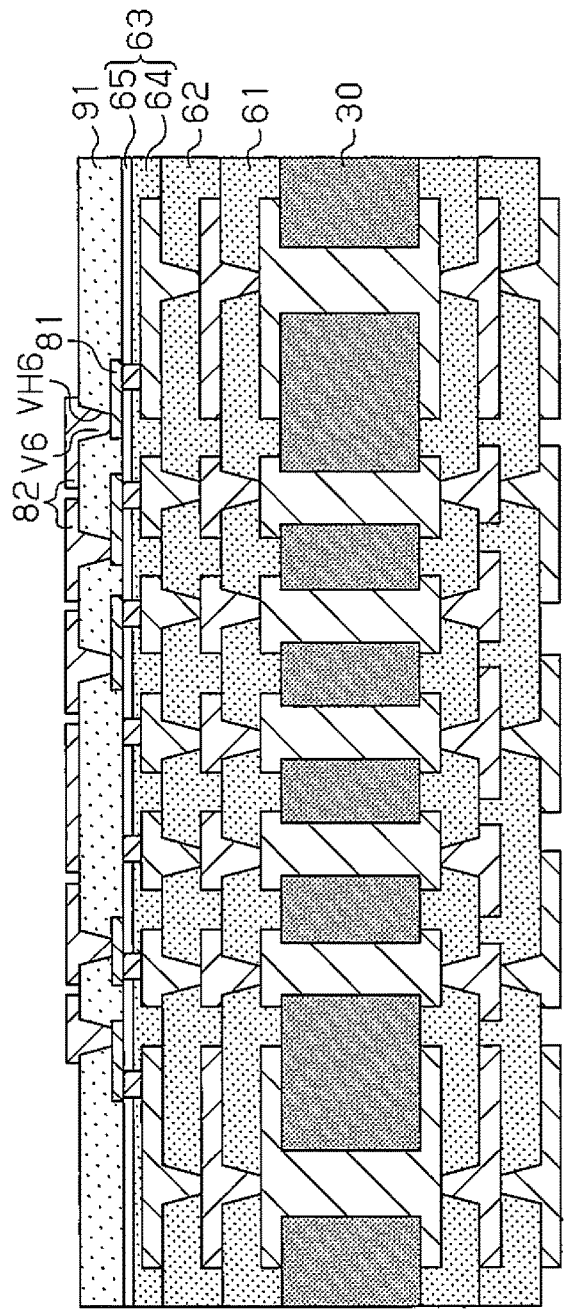

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2013-079781, filed on Apr. 5, 2013, the entire contents of which are incorporated herein by reference.

FIELD

This disclosure relates to wiring substrates, semiconductor devices, and a method for manufacturing wiring substrates.

BACKGROUND

Mounting components such as semiconductor chips are mounted on wiring substrates having various shapes and structures. Semiconductor chips have become further integrated and sophisticated. This has increased the number of wiring layers and reduced the size of wires in wiring substrates on which semiconductor chips are mounted. To manufacture such a wiring substrate, for example, a single-Damascene process may be performed to form wires. The single-Damascene process etches an interlayer insulation layer to form wiring trenches and deposits copper in the wiring trenches to form a copper layer. Then, chemical mechanical polishing (CMP) is performed to remove the copper layer located above and outside the wiring trenches. This flattens the copper layer. Japanese Laid-Open Patent Publication No. 2000-332111 describes a prior art example of the single-Damascene process.

SUMMARY

The CMP polishes the copper layer using the interlayer insulation layer as a stopper layer. However, the CMP may form fine scratches in the polished surface of the interlayer insulation layer. The scratches may have depths of, for example, two micrometers or less. The inventors of the present invention have found that the scratches are formed when filler grains are separated from the interlayer insulation layer. The CMP uses slurry containing abrasive grains. The filler grains are approximately ten times greater in size than the abrasive grains. Thus, the filler grains, which are separated from the interlayer insulation layer when polishing is performed during the CMP, act as abrasive grains that scratch a resin surface (insulation layer). When a photolithography process is performed to pattern a resist layer applied to the interlayer insulation layer, such scratches, which are fine pits formed in the surface of the interlayer insulation layer, may cause patterning defects in the resist layer. This decreases the manufacturing yield of the wiring substrates.

One aspect of the present invention is a wiring substrate including a first insulation layer, a first wiring layer formed on the first insulation layer, and a second insulation layer stacked on the first insulation layer. The second insulation layer covers the first insulation layer and includes a filler. A third insulation layer is stacked on the second insulation layer. The third insulation layer is filler-free. A through electrode extends through the second and third insulation layers in a thicknesswise direction. A second wiring layer is stacked on the third insulation layer and the through electrode. The through electrode electrically connects the second wiring layer to the first wiring layer.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic cross-sectional view illustrating one embodiment of a semiconductor device;

FIG. 1B is an enlarged cross-sectional view illustrating a portion of the semiconductor device of FIG. 1;

FIGS. 2A to 2C, 3A, 3B, 4A, 4B, 5A, 5B, 6A, 6B, 7A, 7B, 8A, 8B, 9A, 9B, and 10 to 13 are schematic cross-sectional views illustrating the procedures for manufacturing the semiconductor device of FIG. 1.

DESCRIPTION OF THE EMBODIMENTS

Figure 3A:
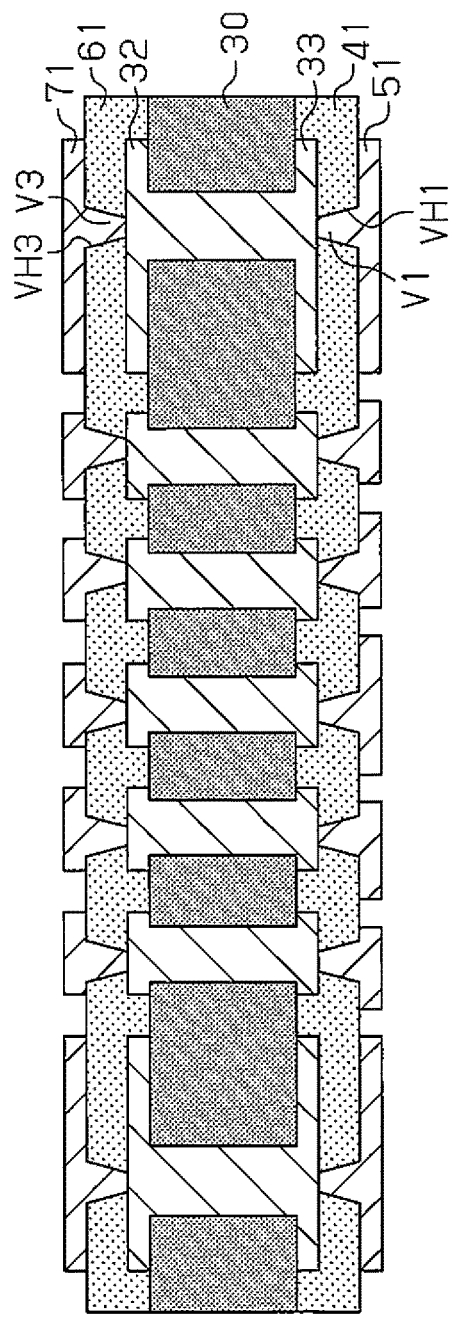

One embodiment will now be described with reference to the drawings. In the drawings, elements are illustrated for simplicity and clarity and have not necessarily been drawn to scale. To facilitate understanding, hatching lines may not be illustrated in the cross-sectional drawings.

As illustrated in FIG. 1A, a semiconductor device 10 includes a wiring substrate 20 and a semiconductor chip 21, which is mounted on the wiring substrate 20.

The wiring substrate 20 includes a core substrate 30 located at an intermediate position in the thicknesswise direction. The core substrate 30 may be a glass epoxy substrate formed by impregnating reinforcement material, such as a glass cloth, with a thermosetting insulative resin, the main component of which is an epoxy resin, and hardening the insulative resin. The reinforcement material is not limited to a glass cloth and may be, for example, a glass non-woven cloth, an aramid cloth, an aramid non-woven cloth, a liquid crystal polymer (LCP) cloth, or an LCP non-woven cloth. Further, the thermosetting insulative resin is not limited to epoxy resin and may be, for example, a polyimide resin or a cyanate resin. The core substrate 30 may have a thickness of, for example, 80 to 400 μm.

The core substrate 30 includes through holes 30X at certain locations (seven locations in FIG. 1A). The through holes 30X extend through the core substrate 30 from an upper surface 30A to a lower surface 30B. A through electrode 31, which is formed in each through hole 30X, extends through the core substrate 30 in the thicknesswise direction. The through electrode 31 fills the corresponding through hole 30X. Although not illustrated in the drawing, the through electrode 31 may be circular as viewed from above. The through electrode 31 may have a diameter of, for example, 50 to 100 μm and be formed from copper (Cu) or a copper alloy.

A wiring layer 32 is formed on the upper surface 30A of the core substrate 30. A wiring layer 33 is formed on the lower surface 30B of the core substrate 30. The through electrodes 31 electrically connect the wiring layers 32 and 33 to each other. The wiring layers 32 and 33 may be formed from, for example, copper or a copper alloy. The wiring layers 32 and 33 may each have a thickness of, for example, 20 to 35 μm.

An insulation layer 41 covering the wiring layer 33, a wiring layer 51 formed on the lower surface of the insulation layer 41, an insulation layer 42 covering the wiring layer 51, and a wiring layer 52 formed on the lower surface of the insulation layer 42 are sequentially stacked on the wiring layer 52. A solder resist layer 43 is stacked on the lower sides of the insulation layer 42 and the wiring layer 52.

Through holes VH1 extend in the thicknesswise direction through the insulation layer 41 at certain locations. A via V1 is formed in each through hole VH1 to electrically connect the wiring layer 33 to the wiring layer 51. Accordingly, the via V1 extends through the insulation layer 41 in the thicknesswise direction.

Through holes VH2 extend in the thicknesswise direction through the insulation layer 42 at certain locations. A via V2 is formed in each through hole VH2 to electrically connect the wiring layer 51 to the wiring layer 52. Accordingly, the via V2 extends through the insulation layer 42 in the thicknesswise direction.

The through holes VH1 and VH2 and the vias V1 and V2 are each tapered so that the diameter decreases from the lower side (wiring layer 52) toward the upper side (core substrate 30) as viewed in FIG. 1A. For example, the through holes VH1 and VH2 each have the form of a truncated cone in which the upper open end is smaller in diameter than the lower open end. In the same manner, the vias V1 and V2 each have the form of a truncated cone so that the upper surface is smaller in diameter than the lower surface.

The wiring layers 51 and 52 may each have a thickness of, for example, 20 to 35 μm. The thickness of the insulation layer 41 from the lower surface of the wiring layer 33 to the lower surface of the insulation layer 41 may be, for example, 15 to 35 μm. The thickness of the insulation layer 42 from the lower surface of the wiring layer 51 to the lower surface of the insulation layer 42 may be, for example, 15 to 35 μm.

The wiring layers 51 and 52 and the vias V1 and V2 may be formed from, for example, copper or a copper alloy. The insulation layers 41 and 42 may be formed from, for example, an insulative resin such as an epoxy resin or a polyimide resin. Alternatively, the insulation layers 41 and 42 may be formed from an insulative resin containing a filler such as silica or alumina. The insulation layers 41 and 42 may also be formed from, for example, a photosensitive insulative resin or a thermosetting insulative resin.

The solder resist layer 43 includes openings 43X, each exposing a portion of the wiring layer 52 as an external connection pad P1. The external connection pad P1 is set as a region for connecting an external connection terminal (not illustrated) when mounting the wiring substrate 20 to a mounting substrate such as a motherboard. Examples of the external connection terminal include a solder ball and a lead pin. When necessary, an organic solderability preservative process may be performed on the wiring layer 52 exposed from the opening 43X to form an OSP film on the wiring layer 52. In this case, the OSP film serves as the external connection pad P1.

A metal layer may be formed on the wiring layer 52 exposed from each opening. In this case, the metal layer serves as the external connection pad P1. Examples of the metal layer include a gold (Au) layer; a nickel (Ni)/Au layer (metal layer in which an Ni layer and an Au layer are stacked in this order); and an Ni/palladium (Pd)/Au layer (metal layer in which an Ni layer, a Pd layer, and an Au layer are stacked in this order). The Ni layer, the Au layer, and the Pd layer may be, for example, an electroless plating metal layer formed in an electroless plating process. The Ni layer may be a metal layer formed from Ni or an Ni alloy. The Au layer may be a metal layer formed from Au or an Au alloy. The Pd layer may be a metal layer formed from Pd or a Pd alloy. Further, the wiring layer 52 exposed from the opening 43X may be directly used as the external connection terminal. In the same manner, an OSP film or a metal layer formed on the wiring layer 52 may be directly used as the external connection terminal.

The openings 43X and the external connection pads P1 are each, for example, circular as viewed from above and may have a diameter of, for example, 200 to 300 μm. The thickness of the solder resist layer 43 from the lower surface of the wiring layer 52 to the lower surface of the resist layer 43 may be, for example, 20 to 40 μm. The solder resist layer 43 may be formed from an insulative resin such as an epoxy resin or an acrylic resin.

An insulation layer 61 covering the wiring layer 32, a wiring layer 71 formed on the upper surface of the insulation layer 61, an insulation layer 62 covering the wiring layer 71, a wiring layer 72 formed on the upper surface of the insulation layer 62, and an insulation layer 63 covering the wiring layer 72 are sequentially stacked on the upper surface 30A of the core substrate 30.

Through holes VH3 extend in the thicknesswise direction through the insulation layer 61 at certain locations. A via V3 is formed in each through hole VH3 to electrically connect the wiring layer 32 to the wiring layer 71. Accordingly, the via V3 extends through the insulation layer 61 in the thicknesswise direction.

Through holes VH4 extend in the thicknesswise direction through the insulation layer 62 at certain locations. A via V4 is formed in each through hole VH4 to electrically connect the wiring layer 71 to the wiring layer 72. Accordingly, the via V4 extends through the insulation layer 62 in the thicknesswise direction.

The through holes VH3 and VH4 and the vias V3 and V4 are each tapered so that the diameter decreases from the upper side (wiring layer 72) toward the lower side (core substrate 30) as viewed in FIG. 1A. For example, the through holes VH3 and VH4 each have the form of a truncated cone in which the upper open end is larger in diameter than the lower open end. In the same manner, the vias V3 and V4 each have the form of a truncated cone so that the upper surface is larger in diameter than the lower surface.

The wiring layers 71 and 72 may each have a thickness of, for example, 20 to 35 μm. The thickness of the insulation layer 61 from the upper surface of the wiring layer 32 to the upper surface of the insulation layer 61 may be, for example, 15 to 35 μm. The thickness of the insulation layer 62 from the upper surface of the wiring layer 71 to the upper surface of the insulation layer 62 may be, for example, 15 to 35 μm.

The wiring layers 71 and 72 and the vias V3 and V4 may be formed from, for example, copper or a copper alloy. The insulation layers 61 and 62 may be formed from, for example, an insulative resin such as an epoxy resin or a polyimide resin. Alternatively, the insulation layers 61 and 62 may be formed from an insulative resin containing a filler such as silica or alumina. The insulation layers 61 and 62 may also be formed from, for example, a photosensitive insulative resin or a thermosetting insulative resin.

As illustrated in FIG. 1B, the insulation layer 63 includes an insulation layer 64 and an insulation layer 65. The insulation layer 64, which is formed on the insulation layer 62, covers the upper surface and the side surfaces of the wiring layer 72. The insulation layer 64 includes a filler 64A. The insulation layer 64 may be formed from a resin material obtained by mixing the filler 64A of silica, alumina, or the like to an insulative resin such as an epoxy resin, a polyimide resin, or a cyanate resin. The insulation layer 64 may have a thickness of, for example, 15 to 25 μm.

The insulation layer 65, which is formed on the insulation layer 64, covers the upper surface of the insulation layer 64. The insulation layer 65 is filler-free and does not include a filler. The insulation layer 65 may be formed from, for example, an insulative resin such as an epoxy resin, a polyimide resin, or a cyanate resin, but the insulative resin does not contain a filler. The insulation layer 65 is thinner than the insulation layer 64. Further, the insulation layer 65 may be thinner than a wiring layer 81 formed on an upper surface 65A of the insulation layer 65. The insulation layer 65 is formed on the insulation layer 64 that covers the wiring layer 72. Thus, the insulation layer 65 does not cover a wiring layer like other insulation layers (e.g., insulation layers 62 and 64). In other words, the insulation layer 65 is not used to ensure insulation between stacked wiring layers. This allows the insulation layer 65 to be thinner than the wiring layer 81. It is preferable that the insulation layer 65 be thinner than the wiring layer 81 and the insulation layer 64 to reduce the thickness of the wiring substrate 20.

Through holes VH5 extend in the thicknesswise direction through the insulation layer 63 (insulation layers 64 and 65) at certain locations. As illustrated in FIG. 1B, each through hole VH5 includes a through hole 64X, which extends in the thicknesswise direction through the insulation layer 64, and a through hole 65X, which is in communication with the through hole 64X and extends in the thicknesswise direction through the insulation layer 65. The through hole VH5 (through holes 64X and 65X) has a tetragonal cross-section (straight form) or a reversed trapezoidal cross-section.

A via V5 is formed in each through hole VH5 to electrically connect the wiring layer 72 to the wiring layer 81 which is formed on the upper surface 65A of the insulation layer 65. Accordingly, the via V5 extends through the insulation layer 63 (insulation layers 64 and 65) in the thicknesswise direction. In the same manner as the through hole VH5, the via V5 has a tetragonal cross-section or a reversed trapezoidal cross-section.

The insulation layer 65 includes a flat upper surface. That is, the upper surface of the insulation layer 65 has a low degree of roughness and does not include many ridges and valleys. For example, the upper surface of the insulation layer 65 has a lower degree of roughness than the wall surface of each through hole 65X. Preferably, the upper surface of the insulation layer 65 is set to have a roughness degree in terms of surface roughness Ra that is 10 to 200 nm. The surface roughness Ra is also referred to as an arithmetic mean roughness that is an arithmetic mean of the absolute values of heights, which vary in a measured region, from a surface serving as a mean line.

As illustrated in FIG. 1A, a fine wiring structure 80 is stacked on the upper surface 65A of the insulation layer 63 (insulation layer 65). In the fine wiring structure 80, a wiring layer 81 formed on the insulation layer 65, an insulation layer 91 covering the wiring layer 81, a wiring layer 82 formed on the upper surface of the insulation layer 91, an insulation layer 92 covering the wiring layer 82, a wiring layer 83 formed on the insulation layer 92, an insulation layer 93 covering the wiring layer 83, and a wiring layer 84 formed on the upper surface of the insulation layer 93 are sequentially stacked on the upper surface 65A of the insulation layer 63 (insulation layer 65).

The wiring layers 81 to 84 form finer wires than the wiring layers 71 and 72 and the like located below the fine wiring structure 80. For example, the wiring layers 81 to 84 are each formed in accordance with a fine wire specification in which the wire width/wire interval (i.e., line L/space S) is less than 5 μm/5 μm. Further, the wiring layers 81 to 84 are each thinner than the wiring layers 71 and 72 and the like below the fine wiring structure 80. For example, the wiring layers 81 to 84 may each have a thickness of 1 to 10 μm.

Through holes VH6 extend in the thicknesswise direction through the insulation layer 91 at certain locations. A via V6 is formed in each through hole VH6 to electrically connect the wiring layer 81 to the wiring layer 82. Accordingly, the via V6 extends through the insulation layer 91 in the thicknesswise direction.

Through holes VH7 extend in the thicknesswise direction through the insulation layer 92 at certain locations. A via V7 is formed in each through hole VH7 to electrically connect the wiring layer 82 to the wiring layer 83. Accordingly, the via V7 extends through the insulation layer 92 in the thicknesswise direction.

Through holes VH8 extend in the thicknesswise direction through the insulation layer 93 at certain locations. A via V8 is formed in each through hole VH8 to electrically connect the wiring layer 83 to the wiring layer 84. Accordingly, the via V8 extends through the insulation layer 93 in the thicknesswise direction.

The through holes VH6 to VH8 and the vias V6 to V8 are each tapered so that the diameter decreases from the upper side (wiring layer 84) toward the lower side (core substrate 30) as viewed in FIG. 1A. For example, the through holes VH6 to VH8 each have the form of a truncated cone in which the upper open end is larger in diameter than the lower open end. In the same manner, the vias V6 to V8 each have the form of a truncated cone so that the upper surface is larger in diameter than the lower surface.

The insulation layers 91 to 93 are thinner than the insulation layers 61 and 62 and the like formed below the fine wiring structure 80. For example, the thickness of the insulation layer 91 from the upper surface of the wiring layer 81 to the upper surface of the insulation layer 91 may be, for example, 1 to 20 μm. The thickness of the insulation layer 92 from the upper surface of the wiring layer 82 to the upper surface of the insulation layer 92 may be, for example, 1 to 20 μm. Further, the thickness of the insulation layer 93 from the upper surface of the wiring layer 83 to the upper surface of the insulation layer 93 may be, for example, 1 to 20 μm.

The wiring layers 81 to 83 and the vias V6 to V8 may be formed from, for example, copper or a copper alloy. The insulation layers 91 to 93 may be formed from, for example, an insulative resin such as an epoxy resin or a polyimide resin. Alternatively, the insulation layers 91 to 93 may be formed from an insulative resin containing a filler such as silica or alumina. The insulation layers 91 to 93 may also be formed from, for example, a photosensitive insulative resin.

A metal layer 85 is formed on the wiring layer 84. Examples of the metal layer 85 include a metal layer in which an Ni layer and an Au layer are stacked in this order from the upper surface of the wiring layer 84; a metal layer in which an Ni layer, a Pd layer, and an Au layer are stacked in this order from the upper surface of the wiring layer 84; a metal layer in which an Ni layer, a Pd layer, and a silver (Ag) layer are stacked in this order from the upper surface of the wiring layer 84; and a metal layer in which an Ni layer, a Pd layer, an Ag layer, and an Au layer are stacked in this order from the upper surface of the wiring layer 84. The Ni layer, the Au layer, the Pd layer, and the Ag layer may each be, for example, an electroless plating metal layer formed in an electroless plating process. When the metal layer 85 is an Ni/Au layer, the Ni layer may have a thickness of, for example, 0.1 to 3 μm, and the Au layer may have a thickness of 0.01 to 1 μm.

The semiconductor chip 21 is flip chip mounted on the wiring substrate 20. The semiconductor chip 21 includes a circuit formation surface (lower surface in FIG. 1A) on which bumps 22 are arranged. The bumps 22 are bonded to the metal layer 85 (pads) of the wiring substrate 20. This bonds the semiconductor chip 21, which is faced down, to the wiring substrate 20. The bumps 22 electrically connect the semiconductor chip 21 to the metal layer 85 of the wiring substrate 20.

The semiconductor chip 21 may be a logic chip, such as a central processing unit (CPU) chip or a graphics processing unit (GPU) chip. Alternatively, the semiconductor chip 21 may be a memory chip such as a dynamic random access memory (DRAM) chip, a static random access memory (SRAM) chip, or a flash memory chip. The semiconductor chip 21 may have a size of, for example, 3 mm×3 mm to 12 mm×12 mm. Further, the semiconductor chip 21 may have a thickness of, for example, 50 to 100 μm.

The bumps 22 may be, for example, gold bumps or solder bumps. Solder bumps may be formed from, for example, an alloy containing lead (Pb), an alloy containing tin (Sn) and Au, an alloy of Sn and Cu, an alloy of Sn and Ag, an alloy of Sn, Ag, and Cu.

The operation of the semiconductor chip 10 will now be described.

In the wiring substrate 20, the fine wiring structure 80 is formed on the upper surface 65A of the insulation layer 65, which is formed from a filler-free resin. Accordingly, when performing chemical mechanical polishing (CMP) to polish metal (e.g., copper) using the insulation layer 65 as a stopper layer, the CMP does not uncover filler grains on the upper surface 65A of the insulation layer 65, which filler grains would be larger than the abrasive grains contained in the slurry used for CMP. Thus, there are no filler grains that act as abrasive grains. This limits the formation of fine pits, or scratches, in the upper surface 65A of the insulation layer 65. As a result, the upper surface 65A of the insulation layer 65 is still flat and smooth after the CMP process. This allows for the formation of the fine wiring layer 81 on the upper surface 65A of the insulation layer 65.

A method for manufacturing the semiconductor device 10 will now be described.

First, in the step illustrated in FIG. 2A, the through holes 30X are formed in, for example, a copper clad laminate (CCL). The through electrodes 31 are formed in the through holes 30X by performing electrolytic plating or by filling a paste. Further, the wiring layers 32 and 33 are formed on the upper surface 30A and the lower surface 30B of the core substrate 30 by performing a subtractive process.

In the step illustrated in FIG. 2B, the insulation layer 41 is formed covering the lower surface 30B of the core substrate 30 and the wiring layer 33. Further, the insulation layer 61 is formed covering the upper surface 30A of the core substrate 30 and the wiring layer 32. For example, the core substrate 30 may be laminated with a resin film. Then, while the resin film is pressed, a heat treatment may be performed to harden the resin film under a temperature of 130° C. to 200° C. This forms the insulation layers 41 and 61.

In the step illustrated in FIG. 2C, the through holes VH1 are formed at certain locations in the insulation layer 41 to expose portions of the lower surface of the wiring layer 33. Further, the through holes VH3 are formed at certain locations in the insulation layer 61 to expose portions of the upper surface of the wiring layer 32. The through holes VH1 and VH3 may be formed, for example, through laser processing that uses a $CO_2$ laser or a UV-YAG laser. When the insulation layers 41 and 61 are formed from a photosensitive resin, for example, photolithography may be used to form the through holes VH1 and VH3.

When the through holes VH1 and VH3 are formed through laser processing, a desmearing process is performed to remove resin smears from the surfaces of the wiring layers 32 and 33 exposed from the bottom portions of the through holes VH1 and VH3.

In the step illustrated in FIG. 3A, the vias V1 are formed in the through holes VH1 of the insulation layer 41. Further, the wiring layer 51 is stacked on the lower surface of the insulation layer 41. The vias V1 electrically connect the wiring layer 33 to the wiring layer 51. In the same manner, the vias V3 are formed in the through holes VH3 of the insulation layer 61, and the wiring layer 71 is stacked on the upper surface of the insulation layer 61. The vias V3 electrically connect the wiring layer 32 to the wiring layer 71. The vias V1 and V3 and the wiring layers 51 and 71 may be formed through a wire formation process such as a semi-additive process or a subtractive process.

Figure 3B:
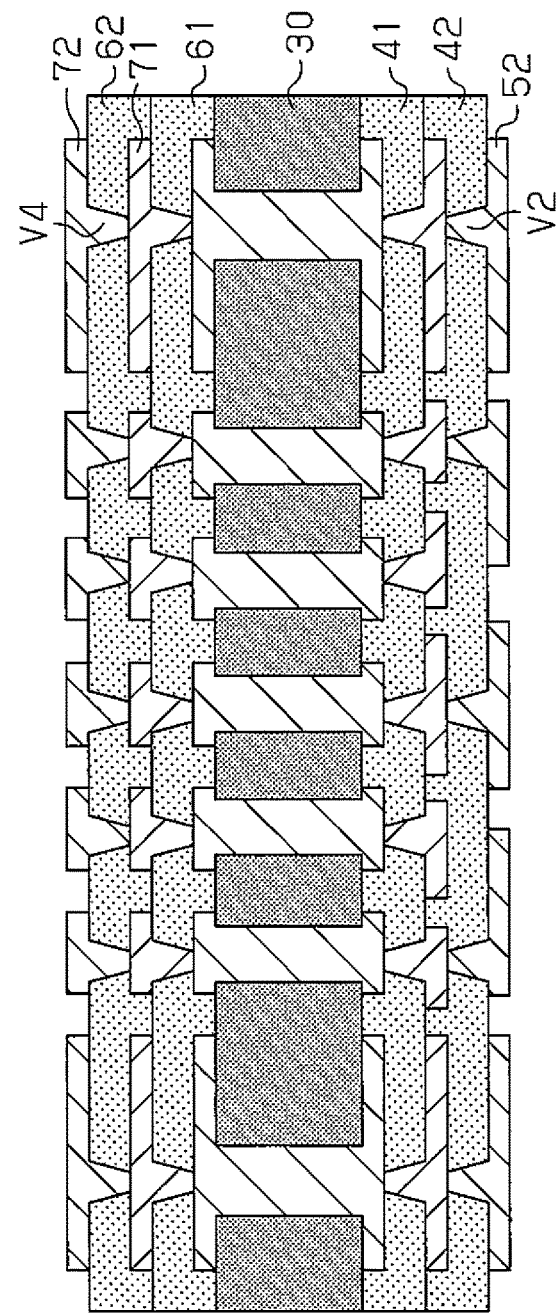

Steps similar to those illustrated in FIGS. 2B, 2C, and 3A are repeated so that, as illustrated in FIG. 3B, the insulation layer 42 and the wiring layer 52 are stacked below the lower surface 30B of the core substrate 30, and the insulation layer 62 and the wiring layer 72 are stacked above the upper surface 30A of the core substrate 30.

In the step illustrated in FIG. 4A, the insulation layer 64 is formed on the upper surface of the insulation layer 62 entirely covering the surfaces (side surfaces and upper surface) of the wiring layer 72. Further, the insulation layer 65 is formed to entirely cover the upper surface of the insulation layer 64. Then, a metal foil 100 is formed to entirely cover the upper surface of the insulation layer 65. For example, thermal compression boding is performed to laminate the insulation layers 64 and 65, which are in a B-stage (semi-cured), and the metal foil 100 to the upper surface of the insulation layer 62. Then, the insulation layers 64 and 65 are hardened by performing a thermal curing process under a temperature of approximately 150° C. The metal foil 100 has a flat and smooth lower surface. Thus, the lamination of the metal foil 100 allows for the upper surface 65A of the insulation layer 65, which contacts the lower surface (flat and smooth surface) of the metal foil 100, to be flat and smooth. The metal foil 100 may be formed from, for example, copper or a copper alloy. The metal foil 100 may have a thickness of, for example, 0.1 to 20 μm.

In the step illustrated in FIG. 4B, openings 100X are formed in the metal foil 100 to expose the insulation layer 65 at regions corresponding to where the through holes VH5 (through holes 64X and 65X, refer to FIG. 1B) are formed.

The openings 100X may be formed, for example, through a subtractive process.

In the step illustrated in FIG. 5A, the metal foil 100, which includes the openings 100X, are used as a conformal mask to irradiate the insulation layers 65 and 64 through the openings 100X with a laser beam and form the through holes VH5 that expose the upper surface of the wiring layer 72. In other words, laser processing is performed to form the through holes 65X in the insulation layer 65 exposed from the openings 100X and form the through holes 64X in the insulation layer 64 exposed from the openings 100X. In the present embodiment, conformal masking is performed to form the through holes VH5. However, the through holes VH5 may be formed through other processes. For example, without forming the openings 100X in the metal foil 100, certain locations of the metal foil 100 and the insulation layers 65 and 64 may undergo direct laser processing to form the through holes VH5. Further, when a photosensitive resin is used to form the insulation layers 64 and 65, for example, photolithography may be performed to form the through holes VH5 (through holes 64X and 65X).

When the through holes VH5 are formed though laser processing, a desmearing process is performed to remove resin smears from the surface of the wiring layer 72 exposed from the bottom portions of the through holes VH5. Here, since the metal foil 100 entirely covers the upper surface 65A of the insulation layer 65, the metal foil 100 protects the upper surface 65A of the insulation layer 65 from the desmearing process. That is, the metal foil 100 prevents the upper surface 65A of the insulation layer 65 from being etched by the desmearing process. In this manner, the metal foil 100 limits roughening of the upper surface 65A of the insulation layer 65. As a result, the upper surface 65A of the insulation layer 65 remains flat and smooth. Further, the desmearing process roughens the exposed wall surfaces of the through hole VH5 (through holes 64X and 65X). Thus, after the desmearing process, the wall surfaces of the through holes VH5 have a higher surface roughness than the upper surface 65A of the insulation layer 65.

In the step illustrated in FIG. 5B, a seed layer (not illustrated) is formed entirely on the surface of the metal foil 100 including the wall surfaces of the openings 100X and the wall surfaces of the through holes VH5. Then, electrolytic plating (panel plating) is performed using the seed layer as a power supplying layer. This fills the through holes VH5 and the openings 100X and deposits an electrolytic copper plating layer 101 (conductive layer) entirely covering the upper surface of the metal foil 100.

Figure 6A:
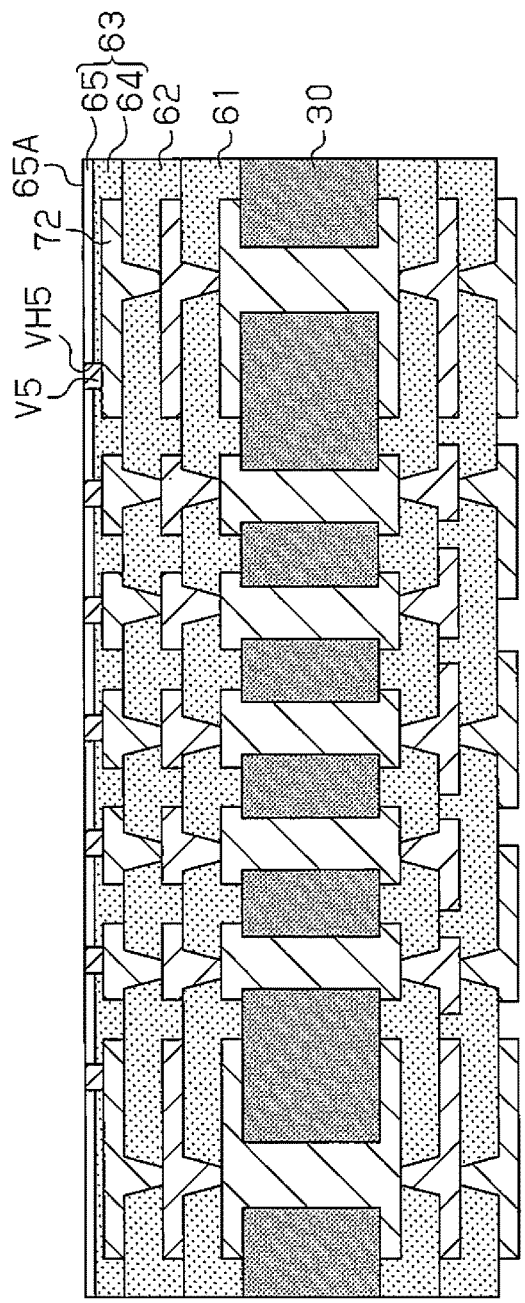

In the step illustrated in FIG. 6A, CMP is performed to polish the electrolytic copper plating layer 101 and the metal foil 100, which are located above the upper surface 65A of the insulation layer 65. This forms the vias V5, each having an end surface flush with the upper surface 65A of the insulation layer 65. The CMP performed in the present embodiment uses the insulation layer 65 as a stopper layer. Thus, the slurry material and the hardness of the polishing pad are set so that the polished amount of the insulation layer 65 is sufficiently smaller than the polished amount of the electrolytic copper plating layer 101 and the metal foil 100.

The insulation layer 65 formed immediately below the metal foil 100 does not include a filler. Thus, there are no filler grains that are separated from the insulation layer 65 when CMP is performed. This limits the formation of fine pits, or scratches, in the upper surface 65A of the insulation layer 65 and keeps the upper surface 65A of the insulation layer 65 flat and smooth.

Figure 6B:
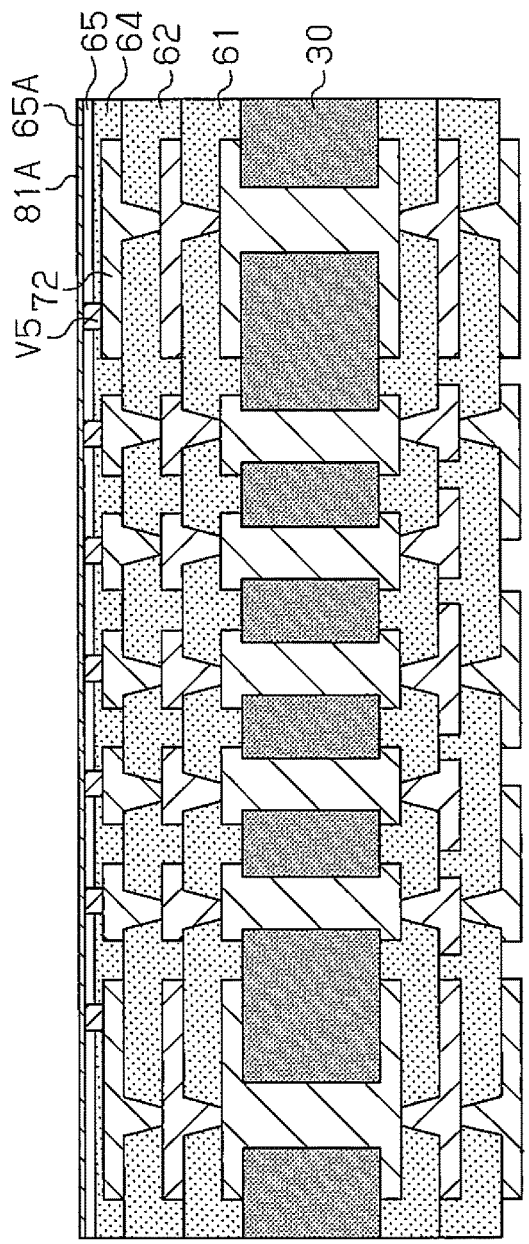

In the step illustrated in FIG. 6B, a seed layer 81A covering the upper surface 65A of the insulation layer 65 and the upper surfaces of the vias V5 by performing, for example, sputtering. The seed layer 81A is formed in conformance with the upper surface 65A of the insulation layer 65. Thus, in the same manner as the upper surface 65A of the insulation layer 65, the upper surface of the seed layer 81A is flat and smooth. The seed layer 81A may be formed from, for example, copper or a copper alloy.

In the step illustrated in FIG. 7A, a resist layer 102 including an opening pattern 102X is formed on the seed layer 81A. The opening pattern 102X exposes the seed layer 81A at portions corresponding to regions where the wiring layer 81 (refer to FIG. 1A) is formed. The resist layer 102 may be formed from a plating resistant material to prepare for the plating process performed in the following step. For example, the resist layer 102 may be formed from a photosensitive dry film resist (e.g., dry film resist of a novolac resin or an acrylic resin) or a liquid photoresist. When using a photosensitive dry film resist, thermal compression bonding is performed to laminate the dry film to the upper surface of the seed layer 81A. Then, photolithography is performed to pattern the dry film and form the resist layer 102 that includes the opening pattern 102X. When using a liquid photoresist, similar procedures are performed to form the resist layer 102. Since the upper surface of the seed layer 81A remains flat and smooth, the occurrence of patterning defects is limited in the resist layer 102. In other words, the opening pattern 102X may be formed with high accuracy in the resist layer 102.

In the step illustrated in FIG. 7B, electrolytic plating (electrolytic copper plating) is performed using the resist layer 102 as a plating mask and the seed layer 81A as a plating power supplying layer. This forms an electrolytic copper plating layer 81B on the upper surface of the seed layer 81A exposed from the opening pattern 102X of the resist layer 102.

In the step illustrated in FIG. 8A, the resist layer 102 is removed. Further, the unnecessary seed layer 81A is etched and removed. As a result, the seed layer 81A and the electrolytic copper plating layer 81B form the wiring layer 81 on the insulation layer 65. In this manner, the wiring layer 81, which is finer than the wiring layers 71 and 72 and the like, is formed through a semi-additive process.

In the step illustrated in FIG. 8B, the insulation layer 91, which entirely covers the surface of the wiring layer 81, is formed on the upper surface 65A of the insulation layer 65. For example, thermal compression bonding is performed to laminate a resin film to the upper surface 65A of the insulation layer 65 and thereby form the insulation layer 91.

In the step illustrated in FIG. 9A, the through holes VH6, which expose portions of the upper surface of the wiring layer 81, are formed at certain locations of the insulation layer 91 by performing, for example, photolithography.

In the step illustrated in FIG. 9B, the vias V6, which fill the through holes VH6, are formed by performing, for example, a semi-additive process in the same manner as the steps illustrated in FIGS. 6B to 8A. Further, the wiring layer 82 is formed on the insulation layer 91 and the vias V6.

Figure 10:
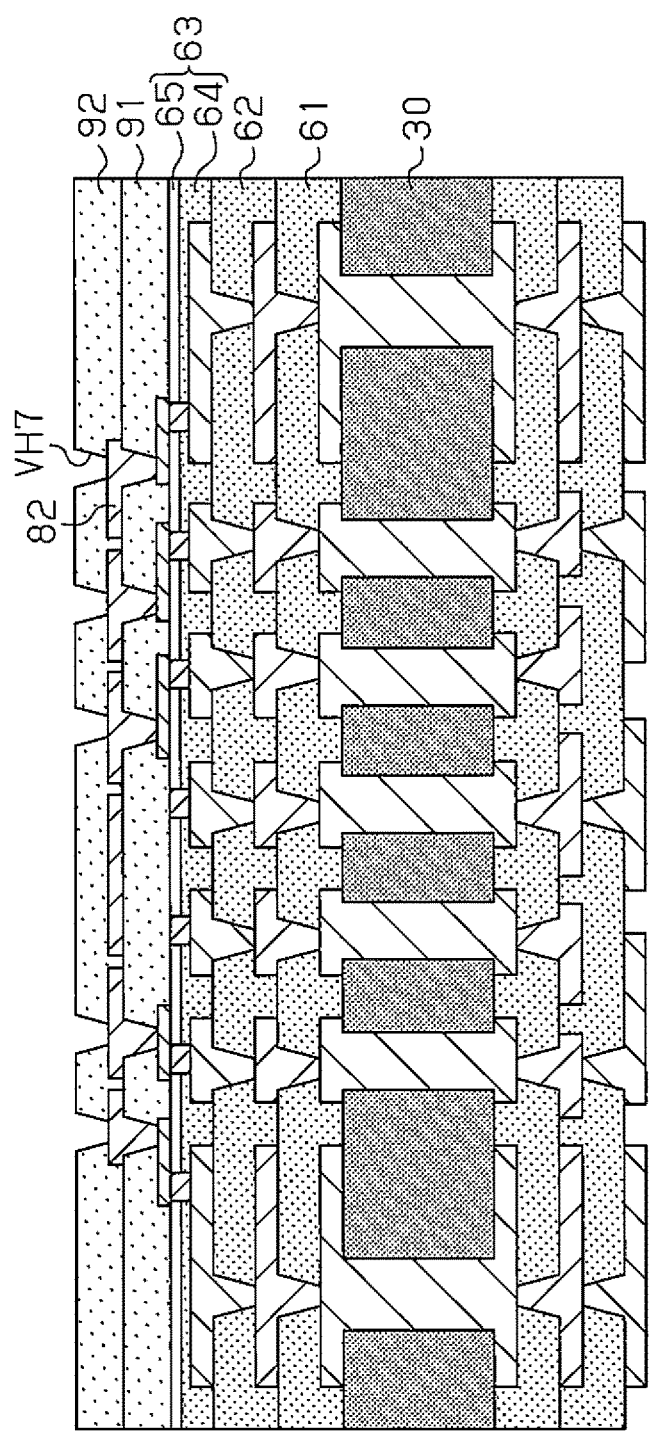

In the step illustrated in FIG. 10, the insulation layer 92 including the through holes VH7, which expose portions of the upper surface of the wiring layer 82, are formed on the insulation layer 91 in the same manner as the steps illustrated in FIGS. 8B and 9A.

Figure 11:
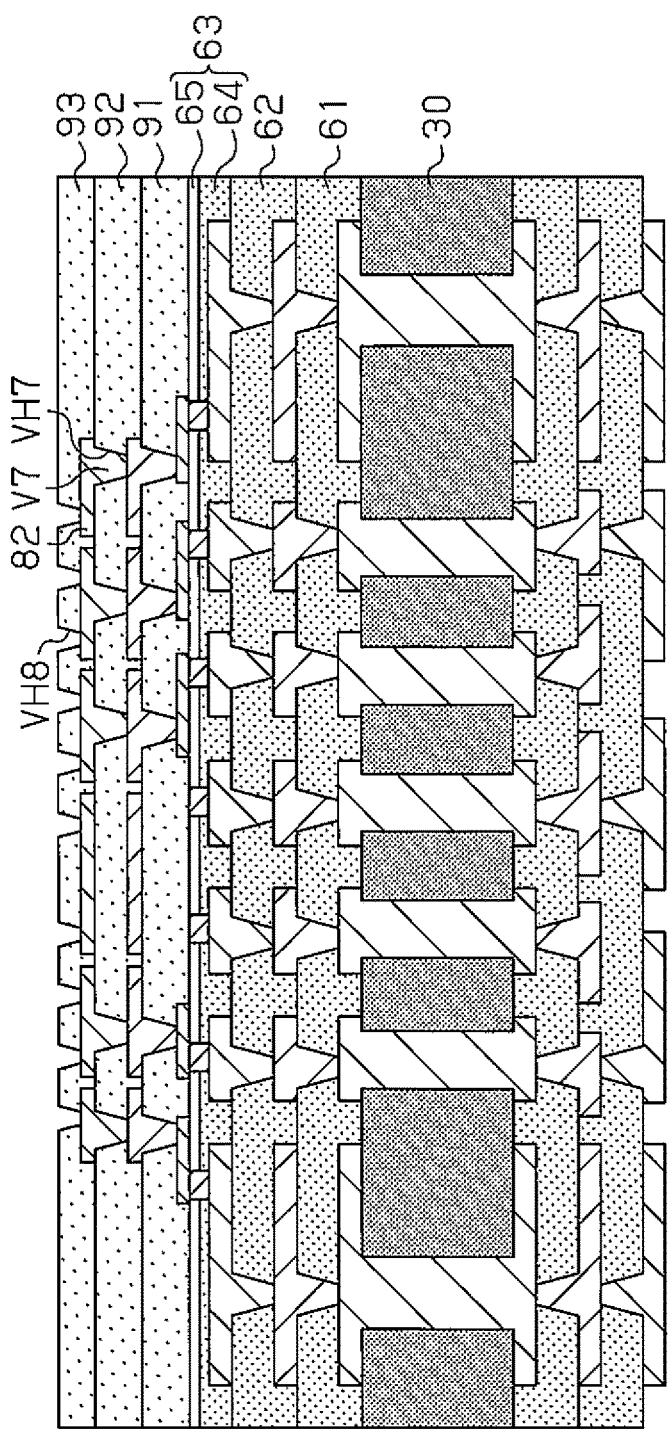

In the step illustrated in FIG. 11, the vias V7, which fill the through holes VH7, are formed by performing, for example, a semi-additive process in the same manner as the steps illustrated in FIGS. 6B to 8A. Further, the wiring layer 83 is formed on the insulation layer 92 and the vias V7. Then, the insulation layer 93 including the through holes VH8, which expose portions of the upper surface of the wiring layer 83, are formed on the insulation layer 92 in the same manner as the steps illustrated in FIGS. 8B and 9A.

Figure 12:
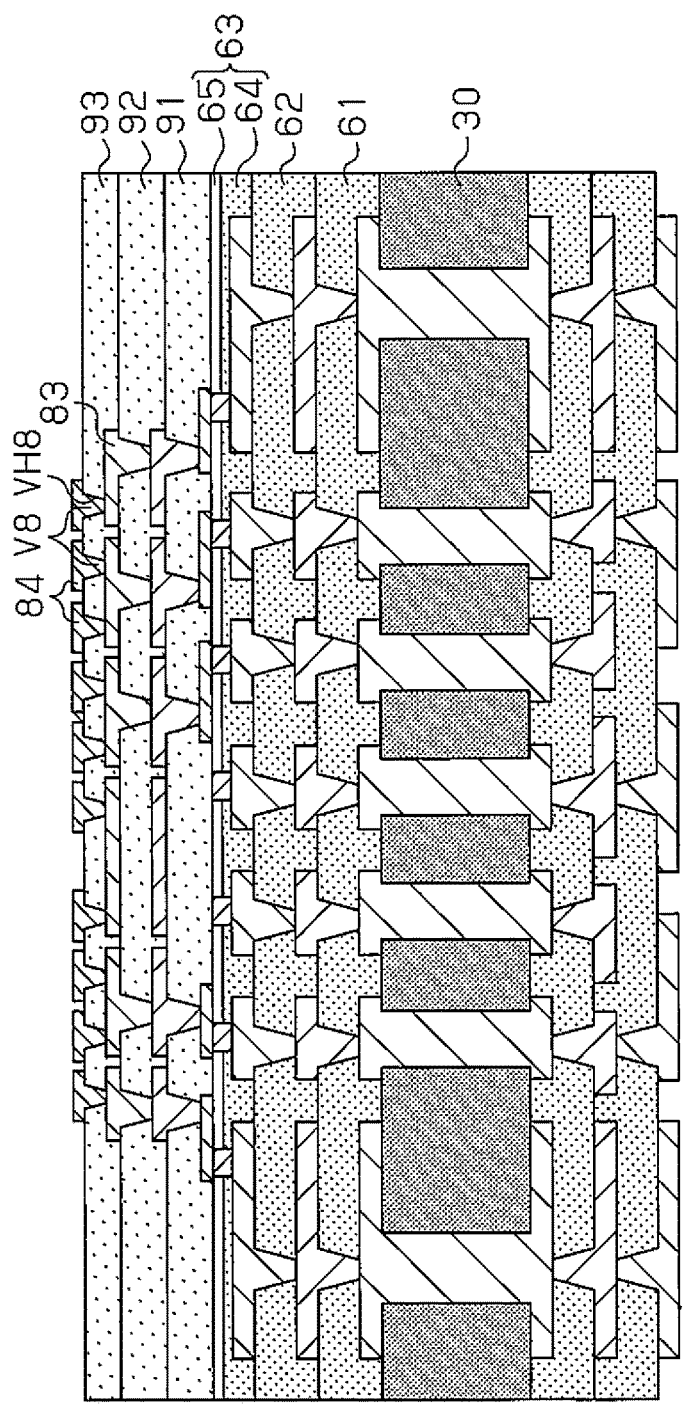

In the step illustrated in FIG. 12, the vias V8, which fill the through holes VH8, are formed by performing, for example, a semi-additive process in the same manner as the steps illustrated in FIGS. 6B to 8A. Further, the wiring layer 84 is formed on the insulation layer 93 and the vias V8.

Figure 13:
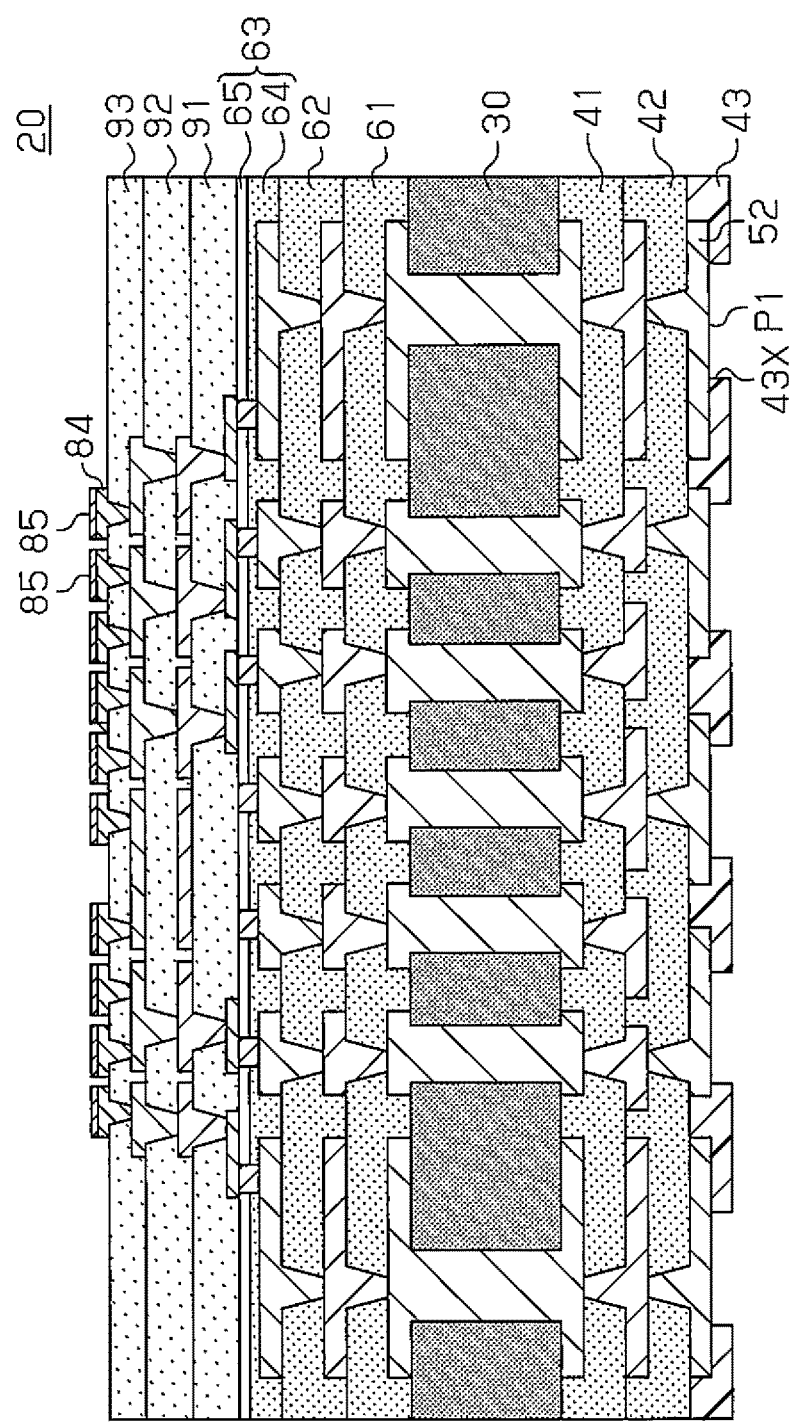

In the step illustrated in FIG. 13, the solder resist layer 43, which includes the openings 43X that expose certain locations of the wiring layer 52 as the external connection pads P1, is stacked on the lower surface of the insulation layer 42.

The solder resist layer 43 may be formed by, for example, laminating a photosensitive solder resist film, or applying a liquid solder resist, and patterning the resist into a predetermined shape.

Then, the metal layer 85 is formed on the wiring layer 84 by performing, for example, electroless plating. For example, when the metal layer is an Ni/Au layer, electroless plating is performed to sequentially stack the Ni layer and the Au layer on the wiring layer 84. When necessary, for example, the Ni layer and the Au layer may be sequentially stacked on the wiring layer 52 (i.e., external connection pads P1) exposed from the openings 43X of the solder resist layer 43.

This completes the wiring substrate 20 illustrated in FIG. 1A.

The semiconductor chip 21 illustrated in FIG. 1A is mounted on the wiring substrate 20, which is manufactured as described above. In the present embodiment, the bumps 22 of the semiconductor chip 21 are flip chip bonded to the metal layer 85 of the wiring substrate 20. This completes the semiconductor device 10 illustrated in FIG. 1A.

The present embodiment has the advantages described below.

(1) The insulation layer 64, which includes the filler 64A, and the insulation layer 65, which is filler-free, are sequentially stacked on the insulation layer 62. After the formation of the electrolytic copper plating layer 101, which extends through the insulation layers 64 and 65 in the thicknesswise direction, CMP is performed to remove the electrolytic copper plating layer 101 located above the upper surface 65A of the insulation layer 65. Since the insulation layer 65, which serves as a stopper layer during the CMP, is filler-free, there are no filler grains separated from the surface polished during the CMP. Accordingly, fine pits, or scratches, do not form in the upper surface 65A of the insulation layer 65. In other words, the upper surface 65A of the insulation layer 65 is still flat and smooth after the CMP. Further, the upper surface of the seed layer 81A, which is formed on the upper surface 65A of the insulation layer 65, may also be kept flat and smooth. The resist layer 102 including the opening pattern 102X is formed on the flat and smooth upper surface of the seed layer 81A. This limits the occurrence of patterning defects in the resist layer 102 and, consequently, limits decreases in the manufacturing yield of the wiring substrate 20.

(2) The metal foil 100 is formed to cover the upper surface 65A of the insulation layer 65. Then, after forming the openings 100X in the metal foil 100 and the through holes VH5 in the insulation layers 64 and 65, a desmearing process is performed using the metal foil 100 as a mask. This manufacturing method protects the upper surface 65A of the insulation layer 65 with the metal foil 100. Thus, the desmearing process does not etch the upper surface 65A of the insulation layer 65, and the upper surface 65A of the insulation layer 65 is still flat and smooth after the desmearing process. As a result, the upper surface of the seed layer 81A formed on the upper surface 65A of the insulation layer 65 also remains flat and smooth. The resist layer 102 including the opening pattern 102X is formed on the flat and smooth upper surface of the seed layer 81A. This limits the occurrence of patterning defects in the resist layer 102 and, consequently, limits decreases in the manufacturing yield of the wiring substrate 20.

(3) The metal foil 100, of which the lower surface is flat and smooth, is stacked on the upper surface 65A of the insulation layer 65. This allows the upper surface 65A of the insulation layer 65, which contacts the lower surface (flat and smooth surface) of the metal foil 100, to be flat and smooth.

It should be apparent to those skilled in the art that the present invention may be embodied in many other specific forms without departing from the spirit or scope of the invention. Particularly, it should be understood that the present invention may be embodied in the following forms.

In the above embodiment, the stacking of the metal foil 100 may be omitted from the step illustrated in FIG. 4A. In this case, the insulation layer 64, which covers the wiring layer 72, and the insulation layer 65, which entirely covers the upper surface of the insulation layer 64, are stacked on the insulation layer 62.

In the above embodiment, the metal layer 85 is formed on the wiring layer 84. Instead, for example, an OSP film may be formed on the wiring layer 84.

The wiring layers 51, 52, 71 and 72 and the insulation layers 41, 42, 61, and 62 of the wiring substrate 20 in the above embodiment may be varied in number and shape. The wiring patterns of the wiring layers 51, 52, 71, and 72 may also be varied in shape.

The wiring layers 81 to 84 and the insulation layers 91 to 93 of the fine wiring structure 80 in the above embodiment may be varied in number and shaped. The wiring patterns of the wiring layers 81 to 84 may also be varied in shape.

In the above embodiment, the fine wiring structure 80 is formed using a cored build-up substrate including the core substrate 30. However, there is particularly no limitation to the structure located below the fine wiring structure 80. For example, the fine wiring structure 80 may be formed using a coreless substrate that does not include a core substrate.

CLAUSES

This disclosure further encompasses various embodiments described below.

According to one embodiment, a method for manufacturing a wiring substrate includes the steps of: forming a first wiring layer on a first insulation layer; stacking a second insulation layer on the first insulation layer, wherein the second insulation layer covers the first wiring layer and includes a filler; stacking a third insulation layer on the second insulation layer, wherein the third insulation layer is filler-free; forming a first through hole and a second through hole respectively extending through the second insulation layer and the third insulation layer, wherein the first and second through holes are in communication with each other and expose a portion of the first wiring layer; depositing a conductive layer that fills the first and second through holes; polishing the conductive layer that is located above an upper surface of the third insulation layer so that the conductive layer forms a through electrode in the first and second through holes; and forming a second wiring layer on the third insulation layer and the through electrode, wherein the through electrode electrically connects the second wiring layer to the first wiring layer.

Implementations of this embodiment of the method may include one or more of the following additional steps. The step of forming a first through hole and a second through hole includes depositing a metal foil on the third insulation layer, forming an opening that extends through the metal foil, forming the first and second through holes in communication with the opening, and desmearing the first and second through holes using the metal foil, which covers the third insulation layer, as a mask. The step of depositing a conductive layer includes forming the conductive layer to fill the first and second through holes and the opening and to entirely cover an upper surface of the metal foil, and the polishing the conductive layer includes performing chemical mechanical polishing to remove the conductive layer and the metal foil located above the upper surface of the third insulation layer.

The present examples and embodiments are to be considered as illustrative and not restrictive, and the invention is not to be limited to the details given herein, but may be modified within the scope and equivalence of the appended claims.

The invention claimed is:

1. A wiring substrate comprising: a first insulation layer composed of a thermosetting insulative resin; a first wiring layer formed on an upper surface of the first insulation layer; a second insulation layer stacked on the upper surface of the first insulation layer and covering the first wiring layer, wherein the second insulation layer includes a filler and is composed of a thermosetting insulative resin; a third insulation layer stacked directly on an upper surface of the second insulation layer, wherein the third insulation layer is filler-free and composed of a thermosetting insulative resin; a through electrode extending through the second and third insulation layers in a thicknesswise direction; and a fine wiring structure stacked directly on the third insulation layer, wherein the fine wiring structure includes: a second wiring layer stacked directly on an upper surface of the third insulation layer and an upper surface of the through electrode, wherein the through electrode electrically connects the second wiring layer to the first wiring layer: a fourth insulation layer formed from a photosensitive insulative resin, wherein the fourth insulation layer is stacked on the third insulation layer and covers the second wiring layer; and a third wiring layer is stacked on the fourth insulation layer and electrically connected to the second wiring layer, the second wiring layer and the third wiring layer form finer wires than wires of the first wiring layer such that the second wiring layer and the third wiring layer each satisfy a fine wire specification in which wire width/wire interval is less than 5 µm/5 µm and wherein each of a thickness of the second wiring layer and a thickness of the third wiring layer being thinner than a thickness of the first wiring layer, the upper surface of the third insulation layer and the upper surface of the through electrode are flush with each other, the third insulation layer includes a first through hole, the second insulation layer includes a second through hole that is communicated with the first through hole, the through electrode extends continuously through the first through hole and the second through hole from the upper surface of the third insulation layer to an upper surface of the first wiring layer, and the upper surface of the third insulation layer is a continuously flat surface that has a lower surface roughness than a wall surface of the first through hole.

2. The wiring substrate according to claim 1, wherein the third insulation layer is thinner than the second insulation layer.

3. The wiring substrate according to claim 1, wherein a side surface of the through electrode contacts an inner wall of the second insulation layer, which defines the second through hole, and wherein the side surface of the through electrode contacts an inner wall of the third insulation layer, which defines the first through hole.

4. The wiring substrate according to claim 1, wherein the upper surface of the third insulation layer and the upper surface of the through electrode are polished surfaces.

5. A semiconductor device comprising: a wiring substrate; and a semiconductor chip that is flip chip mounted on the wiring substrate, wherein the wiring substrate includes a first insulation layer composed of a thermosetting insulative resin, a first wiring layer formed on an upper surface of the first insulation layer, a second insulation layer stacked on the upper surface of the first insulation layer and covering the first wiring layer, wherein the second insulation layer includes a filler and is composed of a thermosetting insulative resin, a third insulation layer stacked directly on an upper surface of the second insulation layer, wherein the third insulation layer is filler-free and composed of a thermosetting insulative resin, a through electrode extending through the second and third insulation layers in a thicknesswise direction, and a fine wiring structure stacked directly on the third insulation layer, wherein the fine wiring structure includes: a second wiring layer stacked directly on an upper surface of the third insulation layer and an upper surface of the through electrode, wherein the through electrode electrically connects the second wiring layer to the first wiring layer: a fourth insulation layer formed from a photosensitive insulative resin, wherein the fourth insulation layer is stacked on the third insulation layer and covers the second wiring layer; and wherein a third wiring layer is stacked on the fourth insulation layer and electrically connected to the second wiring layer, the second wiring layer and the third wiring layer form finer wires than wires of the first wiring layer such that the second wiring layer and the third wiring layer each satisfy a fine wire specification in which wire width/wire Interval is less than 5 µm/5 µm and wherein each of a thickness of the second wiring layer and a thickness of the third wiring layer being thinner than a thickness of the first wiring layer, the upper surface of the third insulation layer and the upper surface of the through electrode are flush with each other, the third insulation layer includes a first through hole, the second insulation layer includes a second through hole that is communicated with the first through hole, the through electrode extends continuously through the first through hole and the second through hole from the upper surface of the third insulation layer to an upper surface of the first wiring layer, and the upper surface of the third insulation layer is a continuously flat surface that has a lower surface roughness than a wall surface of the first through hole.

6. The semiconductor device according to claim 5, wherein a side surface of the through electrode contacts an inner wall of the second insulation layer, which defines the second through hole, and wherein the side surface of the through electrode contacts an inner wall of the third insulation layer, which defines the first through hole.

7. The semiconductor device according to claim 5, wherein the upper surface of the third insulation layer and the upper surface of the through electrode are polished surfaces.

* * * * *

UNITED STATES PATENT AND TRADEMARK OFFICE
CERTIFICATE OF CORRECTION

PATENT NO.         : 9,681,546 B2
APPLICATION NO.    : 14/227453
DATED              : June 13, 2017
INVENTOR(S)        : Satoshi Sunohara and Keiji Yoshizawa It is certified that error appears in the above-identified patent and that said Letters Patent is hereby corrected as shown below:

On the Title Page

Column 2, Line 1, OTHER PUBLICATIONS, delete "Appin." and insert -- Appln. --, therefor.

In the Claims

Column 14, Line 26, in Claim 5, delete "layer:" and insert -- layer; --, therefor.

Column 14, Line 35, in Claim 5, delete "Interval" and insert -- interval --, therefor.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*